(12) United States Patent
Bhatt et al.

(10) Patent No.: US 6,428,729 B1
(45) Date of Patent: Aug. 6, 2002

(54) COMPOSITE SUBSTRATE CARRIER

(75) Inventors: Sanjiv M. Bhatt, Minnetonka; Shawn D. Eggum, Victoria, both of MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 09/317,989

(22) Filed: May 25, 1999

Related U.S. Application Data

(60) Provisional application No. 60/087,205, filed on May 28, 1998, now abandoned.

(51) Int. Cl.[7] .......................... B29C 45/14; B29C 70/76; B29C 70/88
(52) U.S. Cl. ...................... 264/254; 264/255; 264/271.1
(58) Field of Search ................................. 264/250, 254, 264/271.1, 272.11, 272.17, 275, 272.15, 267, 268, 255; 206/711, 454; 211/41, 194; 118/500

(56) References Cited

U.S. PATENT DOCUMENTS

| | | | | |
|---|---|---|---|---|
| 4,269,802 A | * | 5/1981 | Linne | .......................... 264/255 |
| 4,373,113 A | * | 2/1983 | Winkler et al. | ............. 264/254 |
| 4,410,479 A | * | 10/1983 | Cyriax | ........................ 264/255 |
| 4,872,554 A | | 10/1989 | Quernemoen | |
| 5,186,338 A | * | 2/1993 | Boutet | .......................... 211/41 |
| 5,370,142 A | | 12/1994 | Nishi et al. | |
| 5,584,401 A | | 12/1996 | Yoshida | |
| 5,686,040 A | * | 11/1997 | Taber | .......................... 264/268 |
| 5,706,946 A | | 1/1998 | Kakizaki | |
| 5,733,493 A | * | 3/1998 | Katsuno et al. | ............. 264/255 |
| 5,780,127 A | | 7/1998 | Mikkelsen | |
| 6,103,164 A | * | 8/2000 | Bebjak et al. | ............... 264/250 |

FOREIGN PATENT DOCUMENTS

WO      WO96/09787      4/1996

* cited by examiner

*Primary Examiner*—Angela Ortiz
(74) *Attorney, Agent, or Firm*—Patterson, Thuente Skaar & Christensen

(57) ABSTRACT

A wafer carrier is formed from at least two different melt processable plastic materials in which the two plastic materials are strategically positioned for optimal performance and have a thermophysical bond created during an overmolding process. The invention includes carriers made of such different melt processable plastic materials and includes the process for manufacturing such carriers. In a preferred embodiment a H-bar wafer carrier will have a first structural portion molded of polycarbonate in a first mold cavity and will then have the polycarbonate molded portion placed in a second mold cavity and polyetheretherketone will be injection molded to form wafer contact portions on the H-bar carrier. Process temperatures and mold temperatures are controlled to provide optimal bonding between the dissimilar materials. Thus, an integral wafer carrier of composite materials is formed. An additional embodiment utilizes components such as shelves or sidewall inserts for holding wafers molded of two dissimilar plastics and said components are assembled within a disk enclosure such as a transport module.

11 Claims, 8 Drawing Sheets

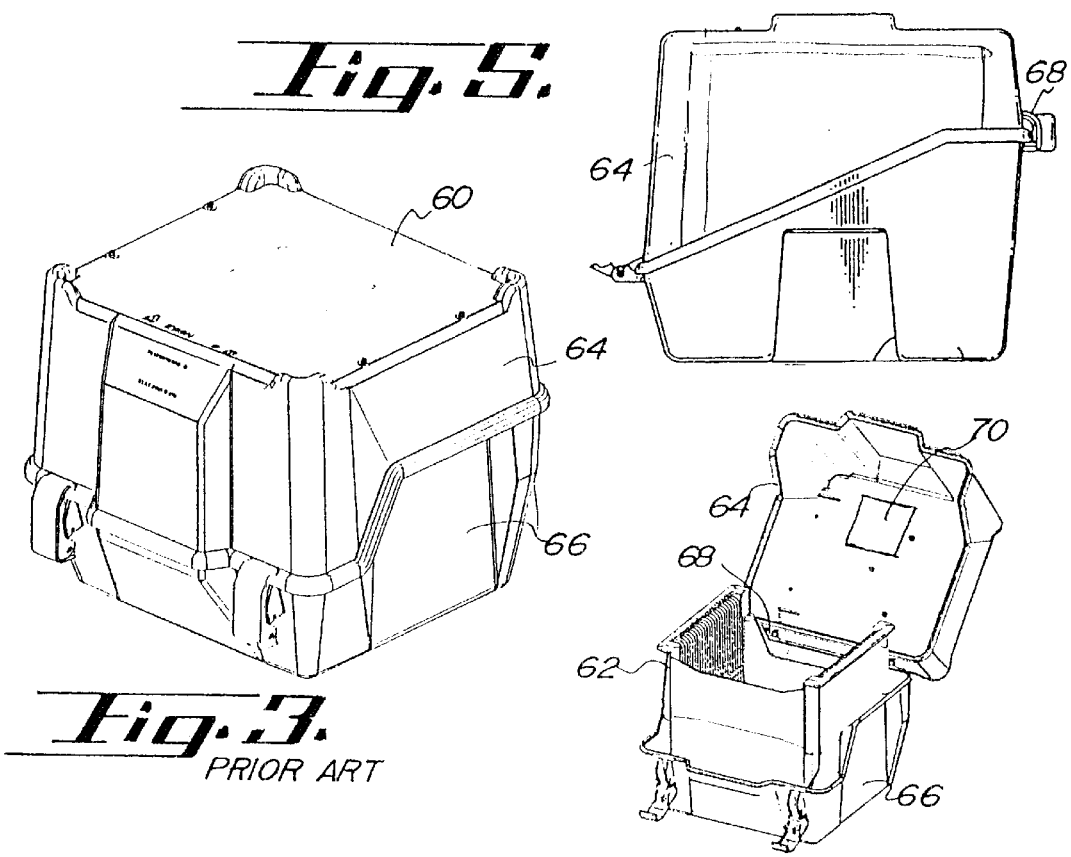
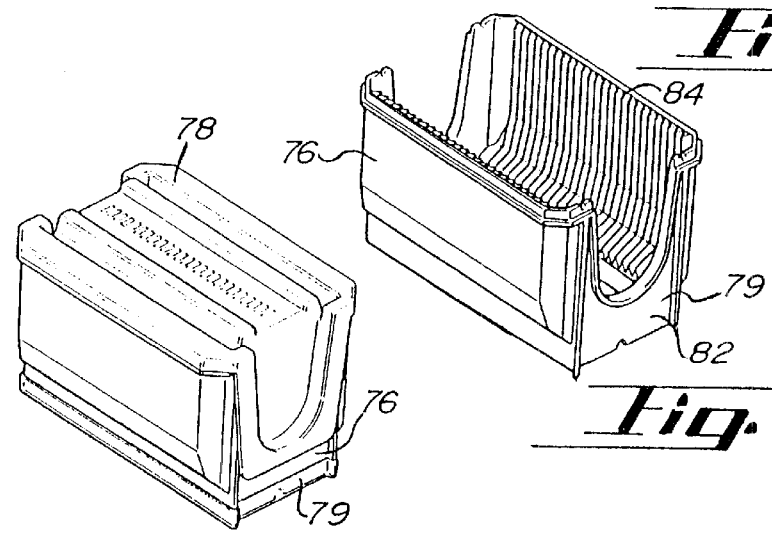

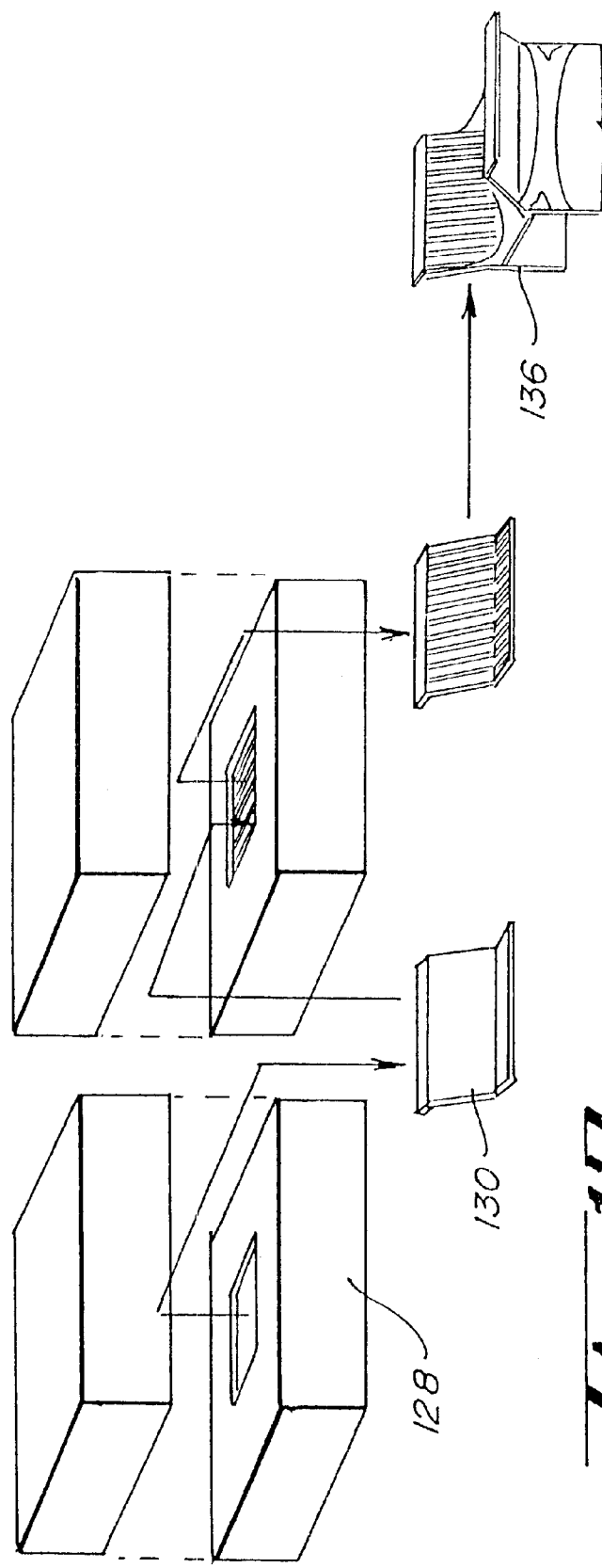

COMPOSITE SUBSTRATE CARRIER

This application is based off of U.S. Provisional Application Ser. No. 60/087,205, filed May 28, 1998, now abandoned.

BACKGROUND OF THE INVENTION

This invention relates to devices for confining memory disk, silicon wafers, and the like for transport, storage, processing. More particularly the invention relates to a composite wafer or disk carrier.

Certain carriers are utilized for transporting and storing batches of silicon wafers or magnetic disks before, during, and after processing of the disks or wafers. The wafers are processed into integrated circuits and the disks are processed into a magnetic storage disks for computers. Wafers when used herein refers to silicon wafers, magnetic substrates, and the like.

The processing of wafer disks into integrated circuit chips often involves several steps where the disks are repeatedly processed, stored and transported. Due to the delicate nature of the disks and their extreme value, it is vital that they are properly protected throughout this procedure. One purpose of a wafer carrier is to provide this protection. Additionally, since the processing of wafer disks is generally automated, it is necessary for disks to be precisely positioned relative to the processing equipment for the robotic removal and insertion of the wafers. A second purpose of a wafer carrier is to securely hold the wafer disks during transport.

Carriers are generally configured to axially arrange the wafers or disks in slots, and to support the wafers or disks by or near their peripheral edges. The wafers or disks are conventionally removable from the carriers in a radial direction upwardly or laterally. Carriers may have supplemental to covers, bottom covers, or enclosures to enclose the wafers or disks.

There are a number of material characteristics which are useful and advantageous for wafer carriers depending on the type of carrier and the particular part of the carrier at issue.

During processing of semiconductor wafers or magnetic disks, the presence of or generation of particulates presents very significant contamination problems. Contamination is accepted as the single biggest cause of yield loss in the semiconductor industry. As the size of integrated circuitry has continue to be reduced, the size of particles which can contaminate an integrated circuit has also become smaller making minimization of contaminants all the more critical. Contaminants in the form of particles may be generated by abrasion such as the rubbing or scraping of the carrier with the wafers or disks, with the carrier covers or enclosures, with storage racks, with other carriers, or with the processing equipment. A most desirable characteristic of a carrier is therefore a resistance to particle generation upon abrasion, rubbing, or scraping of the plastic molded material. U.S. Pat. No. 5,780,127 discusses various characteristics of plastics which are pertinent to the suitability of such materials for wafer carriers. Said patent is incorporated by reference.

Carrier materials should also have minimal outgassing of volatile components as these may leave films which also constitute a contaminant which can damage wafers and disks.

The carrier materials must have adequate dimensional stability, that is rigidity, when the carrier is loaded. Dimensional stability is necessary to prevent damage to the wafers or disks and to minimize movement of the wafers or disks within the carrier. The tolerances of the slots holding wafers and disks are typically quite small and any deformation of the carrier can directly damage the highly brittle wafers or can increase the abrasion and thus the particle generation when the wafers or disks are moved into, out of, or within the carrier. Dimensional stability is also extremely important when the carrier is loaded in some direction such as when the carriers are stacked during shipment or when the carriers integrate with processing equipment. The carrier material should also maintain its dimensional stability under elevated temperatures which may be encountered during storage or cleaning.

Conventional carriers used in the semiconductor industry may develop and retain static charges. When a charged plastic part comes into contact with an electronic device or processing equipment it may discharge in a damaging phenomena known as electrostatic discharge (ESD). Additionally, statically charged carriers may attract and retain particles, particularly airborne particles. Also static buildup on carriers can cause semiconductor processing equipment to automatically shut down. It is most desirable to have a carrier with static dissipation characteristics to eliminate ESD and to avoid attracting particles.

Trace metals are a common ingredient or residue in many potential wafer carrier materials. Metal contamination must be considered in material selection and assembly methods of carriers. Anion contamination in carrier materials can cause contamination and corrosion problems.

Material used in carriers must also be chemically compatible to any chemicals which they may be subjected to. Although transport and storage wafer carriers are not intended for chemical use they must be resistant to cleaning solutions and commonly used solvents such as isopropyl alcohol. Process carriers are subject to ultrapure acids and other harsh chemicals.

Visibility of wafers within closed containers is highly desirable and may be required by end users. Transparent plastics suitable for such containers, such as polycarbonates, are desirable in that such plastic is low in cost but such plastics do not have desirable static dissipative characteristics nor desirable abrasion resistance.

Other important characteristics include the cost of the carrier material and the ease of molding the material.

Carriers are typically formed of injection molded plastics such as polycarbonate (PC), acrylonitrile butadiene styrene (ABS), polypropylene (PP), polyethylene (PE), perfluoroalkoxy (PFA), and polyetheretherketone (PEEK).

Fillers which have been added to injection molded plastics for static dissipation include carbon powder or fiber, metal fibers, metal coated graphite, and organic (amine-based) additives.

One common conventional wafer carrier used for transport and storage is a single molded part generally comprising a front end having an H-bar interface portion, a back end having a panel, and sidewalls having slots and lower curved or converging portions following the curvature of the wafers, and with an open top and open bottom. H-bar carriers will often be reused several times and then discarded. Between uses the carriers will typically be washed in hot wafer and/or other chemicals and they are then dried with hot air. It is a valuable characteristic to have a carrier that holds it shape when subjected to the higher temperatures associated with the cleaning, drying, transporting, and processing the carriers.

Another conventional carrier is a box configured to hold an H-bar carrier. Such boxes are commonly known as work-in-process (WIP) boxes.

Another conventional carrier is a standardized mechanical interface (SMIF) pod which is comprised of a box which sealingly encloses an H-bar carrier which mechanically interfaces with process equipment. SMIF pods typically have a bottom opening door for accessing the H-bar carrier with wafers. Boxes are also known which have front opening doors for accessing the H-bar carrier. Another known carrier is a transport module which is a box enclosure with a front opening door and internal shelves which support the wafers rather than a separate H-bar carrier.

It must be recognized that the ideal material for one part of a carrier is typically not the ideal material for a different part of the same carrier. For example, PEEK is a material that has ideal abrasion resistance characteristics ideal for wafer contact portions but is difficult to mold and is, relative to other plastics, very expensive. Thus, PEEK may not be as good of a choice as other plastics, such a polycarbonate, for structural portions.

The only instances that different materials are known to have been used for different portions of disk carriers is by separately molding the different portions then assembling them into a carrier. Such assembly presents the disadvantage of surface to surface contact of different components which can create particle or contaminant entrapment areas that are difficult to clean. Additionally, the assembly process can generate particles. Moreover, the molding of different component parts and assembling same in a carrier involves labor and thus expense.

SUMMARY OF THE INVENTION

A wafer carrier is formed from at least two different melt processable plastic materials in which the two plastic materials are strategically positioned for optimal performance and have a thermophysical bond created during an overmolding process. The invention includes carriers made of such different melt processable plastic materials and includes the process for manufacturing such carriers. In a preferred embodiment a H-bar wafer carrier will have a first structural portion molded of polycarbonate in a first mold cavity and will then have the polycarbonate molded portion placed in a second mold cavity and polyetheretherketone will be injection molded to form wafer contact portions on the H-bar carrier. Process temperatures and mold temperatures are controlled to provide optimal bonding between the dissimilar materials. Thus, an integral wafer carrier of composite materials is formed. An additional embodiment utilizes components such as shelves or sidewall inserts for holding wafers molded of two dissimilar plastics and said components are assembled within a disk enclosure such as a transport module.

An advantage and feature of the invention is that a carrier may be formed that provides optimal performance characteristics at minimal material and labor costs.

An additional feature and advantage of particular preferred embodiments of the invention is that there is no assembly of component parts while maintaining the advantages of using the combination of the two materials.

An additional feature and object of particular preferred embodiments of the invention is that a substantially integral carrier or component is created by the two plastic portions which are molded together.

Another advantage and feature of the invention is that the juncture between the two dissimilar materials is closed eliminating the potential entrapment of contaminants or other chemicals.

Another object and feature of the invention is that the process can eliminate post molding conditioning of wafer carriers that otherwise could be necessary, such as annealing.

BRIEF DESCRIPTION OF THE DRAWINGS

FIG. 3 is a perspective view of a prior art work-in-process (WIP) box.

FIG. 4 is a perspective view of a WIP box and an H-bar carrier in accordance with the invention.

FIG. 5 is a side elevational view of a WIP box in accordance with the invention.

FIG. 6 is a perspective view of a prior art disk shipper.

FIG. 7 is the body of a disk shipper in accordance with the invention.

FIG. 13 is a schematic illustrating the methodology of the invention.

DETAILED SPECIFICATION

Figure 1:
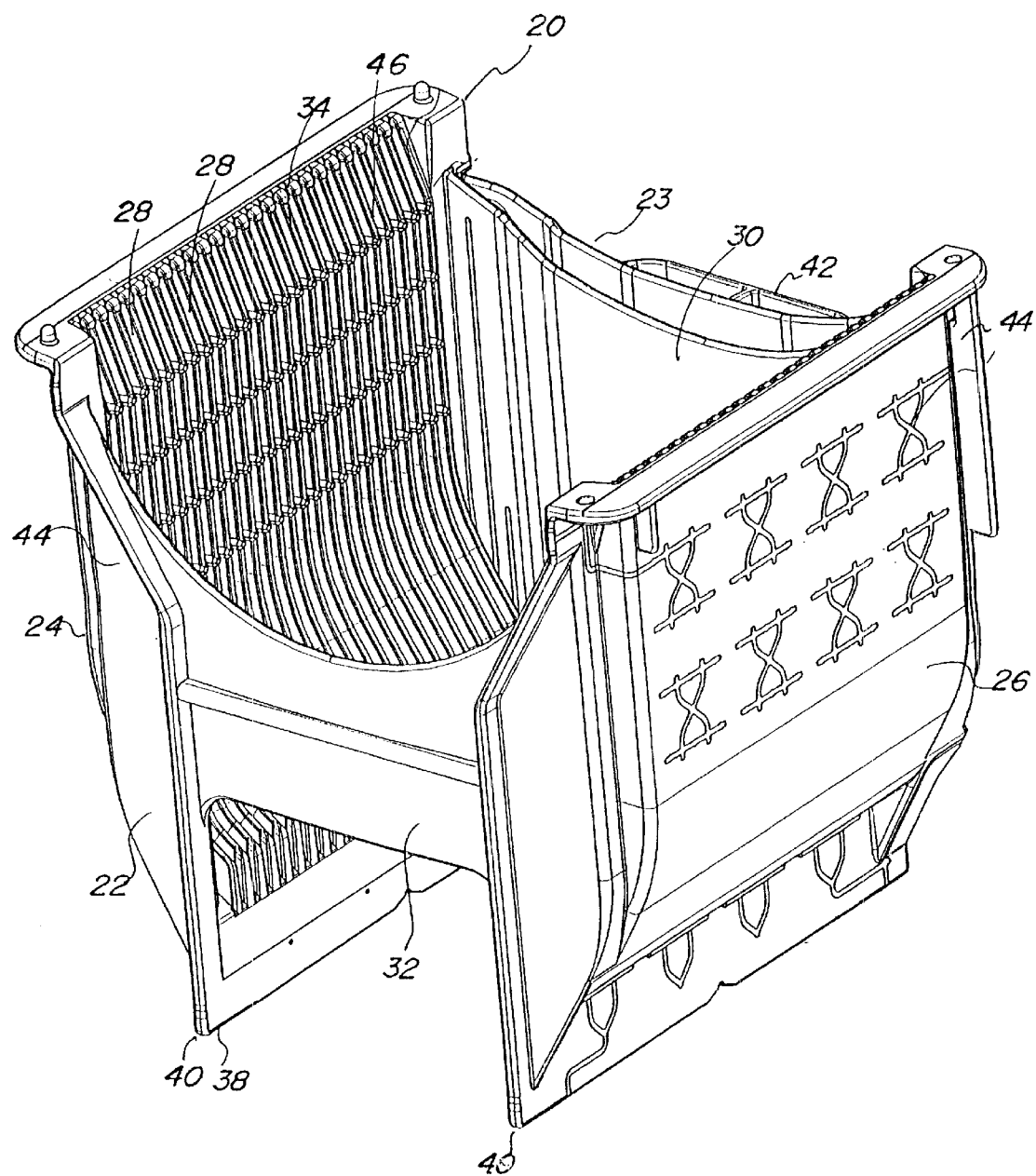
FIG. 1 is an H-bar wafer carrier according to the invention.

Referring to FIG. 1 an H-bar wafer carrier is depicted and is generally indicated with the numeral 20. This carrier has, as in conventional H-bar carriers, a front 22, a back 23, side walls 24, 26, slots for receiving wafers 28, an open top 30, and a machine interface portion configured as an H-bar 32. Each of the slots is defined by a pair of wafer engaging teeth 34.

The traditional H-bar wafer carrier has in addition to the H-bar machine interface, a bottom machine interface 38 which will typically have four feet with a contact at the corners 40. Additionally, a robotic pick-up handle 42 and robotic flanges 44 also function as machine interfaces. The composite H-bar carrier generally has a first base portion 44 and a second overmolded portion 46 configured as wafer engaging portions 46. In this embodiment the wafer carrier 20 is a single integral component 20.

Figure 2:
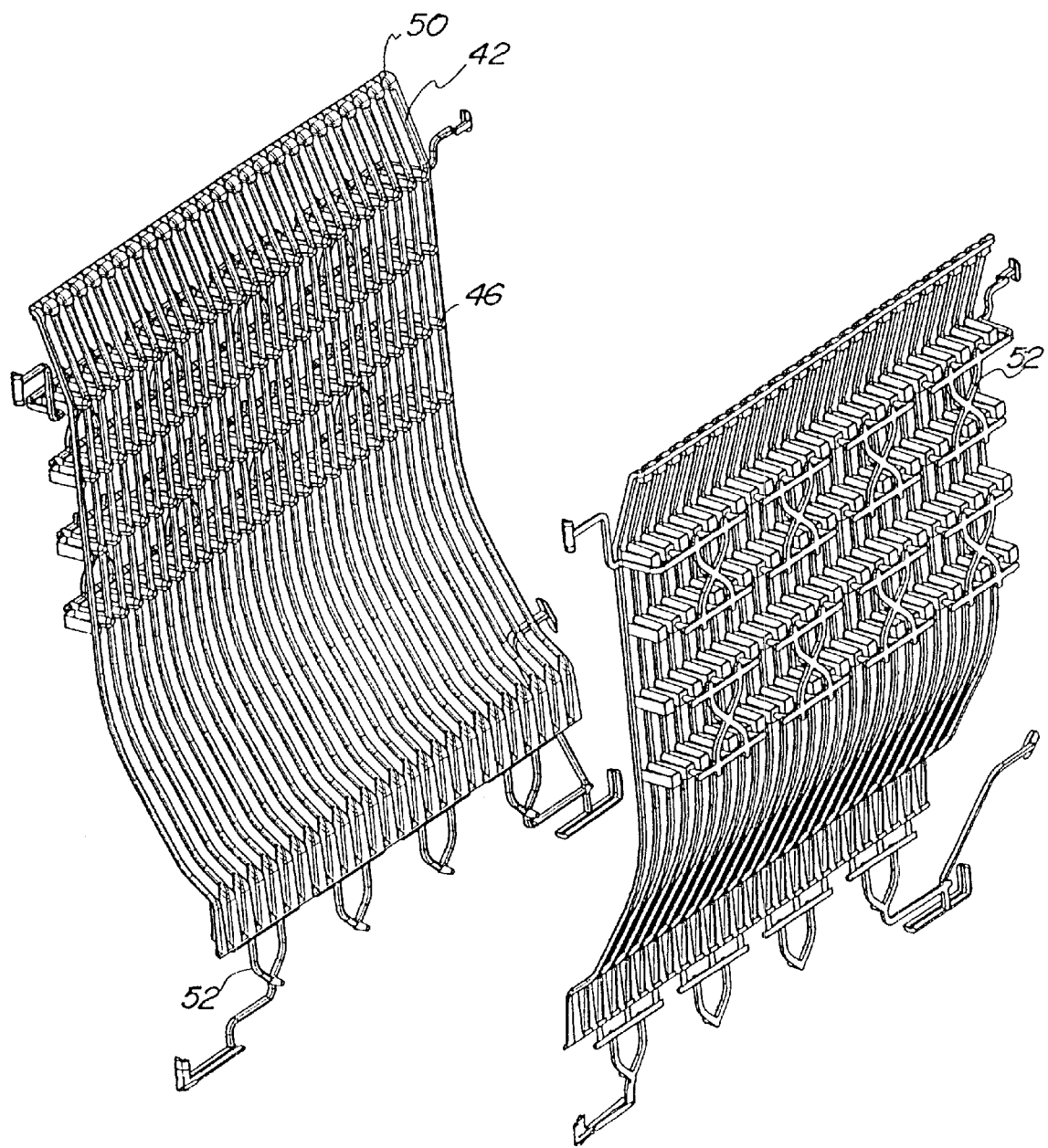
FIG. 2 is a figure showing the overmolded portion of the carrier of FIG. 1.

Referring to FIG. 2 the overmolded portion 50 is shown without the integral base portion and comprises the wafer engaging portions 46 as well as incidental portions 52 which constitute flow paths for the molten overmold material during the mold process. This portion, as shown, reflects the configuration of the mold cavity for the overmolding.

In a preferred embodiment, the support or base portion 44 will be molded of an inexpensive dimensionally stable easily molded plastic such as polycarbonate or polycarbonate with carbon fiber filler. Then the overmolded portion can be molded from another melt processable crystalline plastic such as PEEK or PEEK with carbon fiber filler. These materials are dissimilar with respect to their morphological structure and their processing temperatures. Other pairs of morphologically dissimilar materials could also be utilized with similar advantages as provided by these materials. The amorphus material, polycarbonate, and the crystalline material, PEEK, form a thermophysical bond when the amorphus material comes in contact with the crystalline material in molten state. It is believed that the bond is formed by the virtue of the increase in surface energy of polymer glass at the interface. Therefore, when the hot amorphus melt comes in contact with the polymer glass, the polycarbonate, it elevates the surface energy of the polymer glass and as the hot melt is cooling down, it crystallizes at the interface. It is theorized that the crystallization process attributes to the bond of the two materials. The heat dissipates into the polymer glass at a very slow rate because of its low specific heat and thus the hot melt of PEEK cools at a lower rate increasing the crystallinity at the interface. When this process is carried out in an injection mold, the product formed will have higher crystallinity level at the interface of the polymer glass and crystal than at the interface of the polymer crystal and the mold steel because of the difference in specific heat of steel and polymer glass.

In a preferred embodiment, the polycarbonate, that is the polymer glass, would be molded first and then placed back into an injection mold to mold PEEK over it. In this process the mold temperature is ideally kept below the glass transition temperature of polycarbonate which is approximately 149° C. to prevent distortion of the polycarbonate base portion. The wafer contact portion 50 is strategically positioned and configured such that the wafer shall never come into contact with the polycarbonate.

An alternative amorphus material in which a favorable bond has been observed is polyetherimide (PEI). This bond may have a chemical bonding component.

Various types of bonding components may be involved in the bonding of the overmolded portion to the base portion. It is believed that a thermophysical bond occurs when the molten overmolded material comes into contact with the non-molten base portion. Thermophysical bonding occurs when the molecules of the two portions come within three molecular radii.

Referring to FIGS. 3, 4, and 5, a work-in-process box is disclosed and is generally indicated with the numeral 60. Such a box will typically hold an H-bar wafer carrier 62 and has principal components of a top cover 64, a base portion 66, and an H-bar wafer carrier 62 engaged in and seated on the base portion 66. In this case, "carrier" references either the enclosure box or the enclosure box with the H-bar carrier. Several components may be formed in the overmold process to take advantage of the inherent features and advantages of the process and the invention. For example, in FIG. 5 the top section may be molded of polycarbonate with the hinge 68 overmolded with PEEK to adhere to the top cover section 64. Moreover, referring to FIG. 4 a polycarbonate window 70 may first be molded of a desired configuration and size and inserted into the mold for the cover portion 64 with the balance of the cover portion overmolded to the polycarbonate window. The overmolding allows and provides a juncture of high integrity without the use of adhesives or mechanical fasteners.

Referring to FIGS. 6 and 7, a magnetic disk shipper carrier is typically comprised of a base portion 76, a top cover 78, and portion 79 may be advantageously formed according to the invention by first molding the support portion 82 of the base portion 76 and then injection molding the disk engaging portions 84. Again the support portion 82 may be formed of polycarbonate or similar material and the disk contacting portions may be formed of PEEK or similar material.

Figure 8:
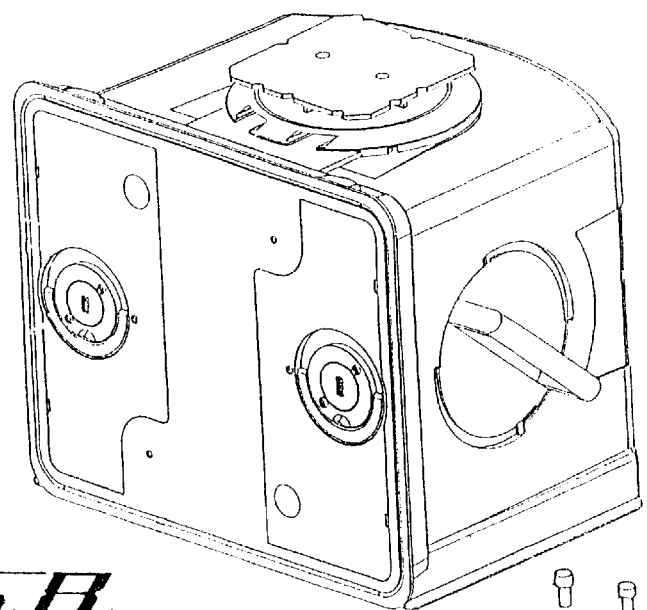
FIG. 8 is a prior art view of transport module.
Figure 9:
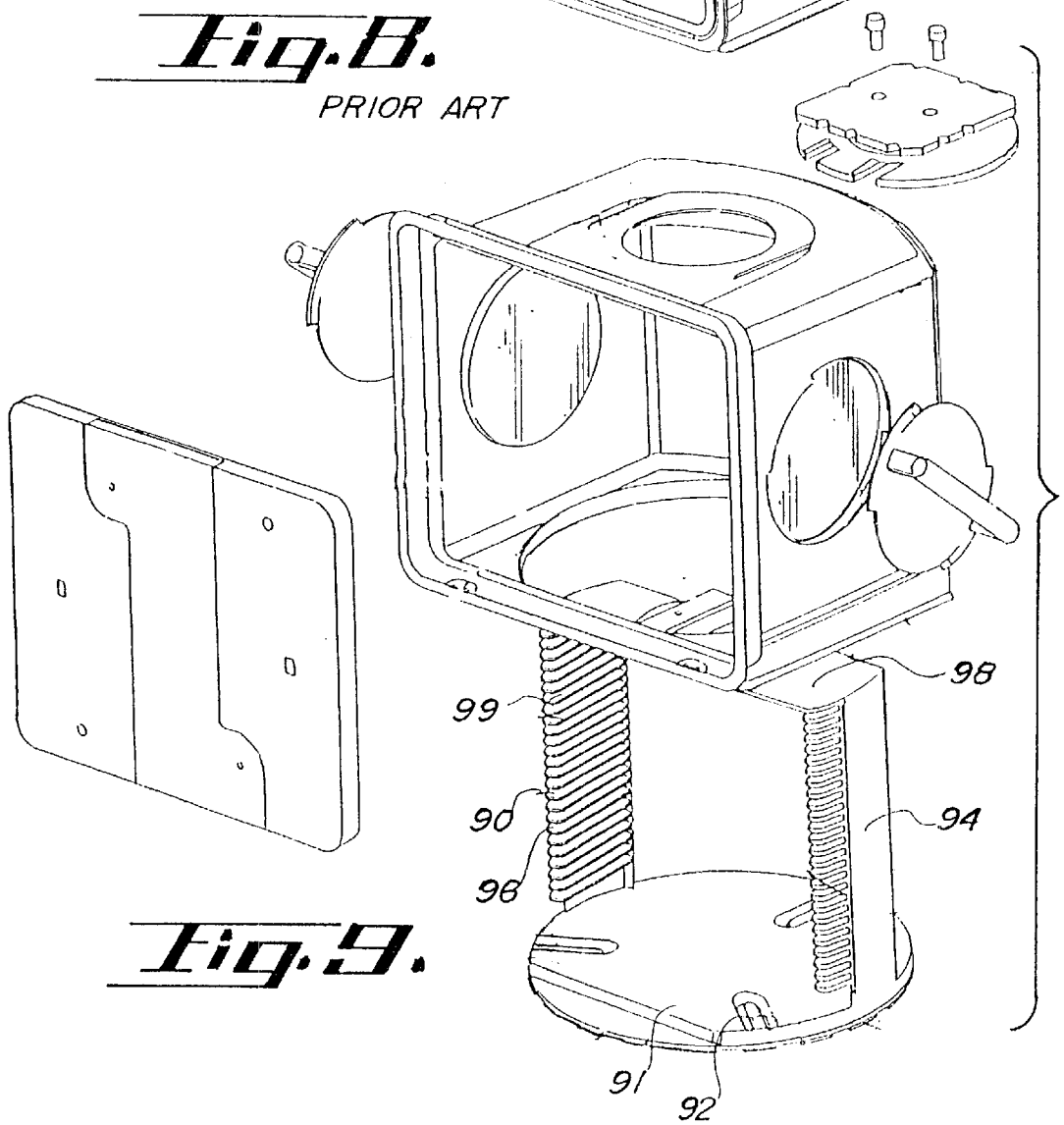
FIG. 9 is an exploded view of a transport module similar to what is shown in FIG. 8 in accordance with the invention.

Referring to FIGS. 8 and 9, a transport module which is intended for use with large semiconductor wafers, for example 300 mm, is shown. In particular configuration the wafer support portion 90 is comprised of a base 91 with a machine interface portion 92, upright columns 94 with wafer support shelves 96, and a top portion 98. The wafer engaging shelves may have an overmolded portion 99 which is the portion that contacts wafers contained by the transport module. The machine interface also may utilized an overmolded portion where it contacts equipment.

Figure 12:
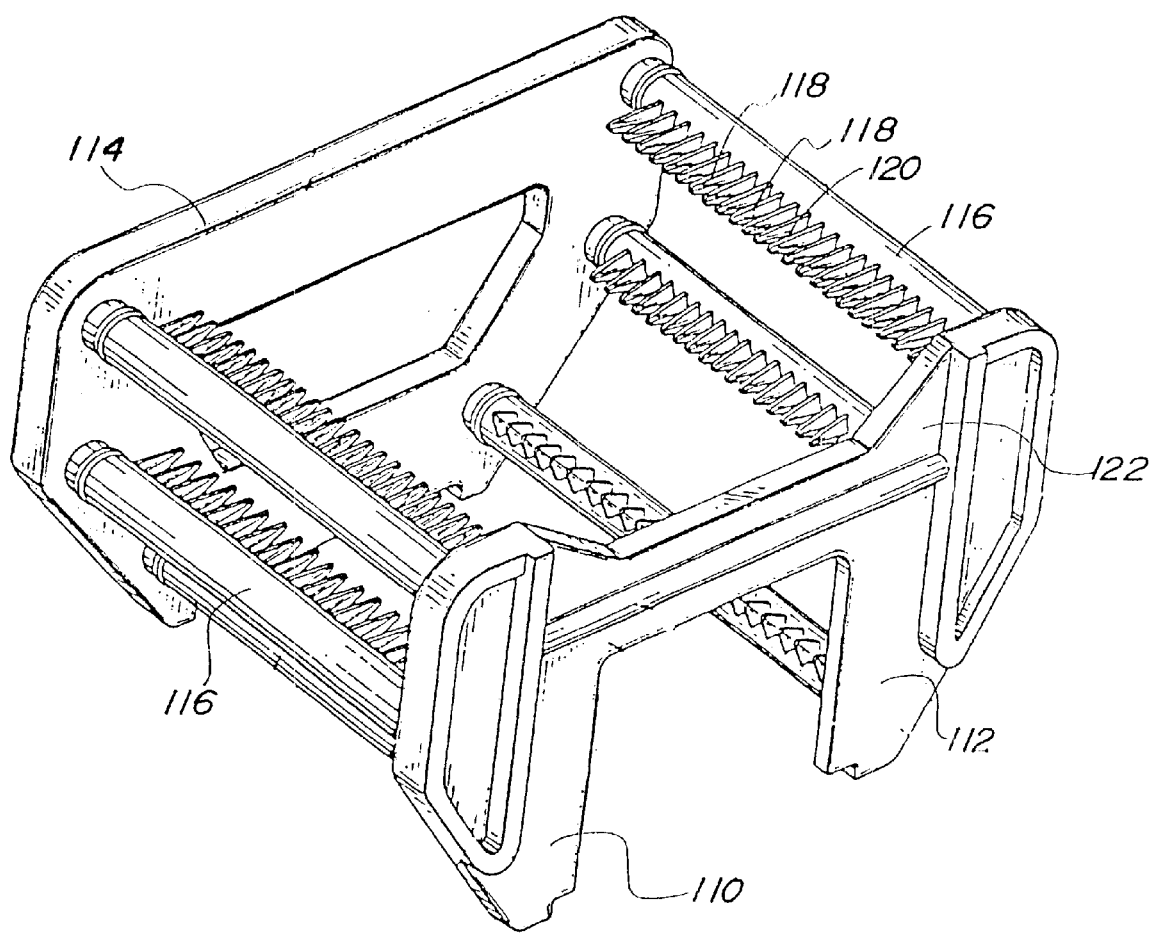
FIG. 12 is a perspective view of a process enhancement carrier in accordance with the invention.

Referring to FIG. 12, an alternate embodiment of a wafer carrier configured as a process enhancement carrier is shown and is generally indicated with the numeral 110. Such process enhancement carrier has base support portions 112 and 114 as well as arms 116 extending therebetween. Each of the arms has a plurality of teeth 118 which define slots 120 for holding wafers during processing steps. In this particular embodiment the exterior portion of the arms 116 and the teeth may be overmolded to a basic base frame work 122 to provide the advantages of the invention.

Figure 10:
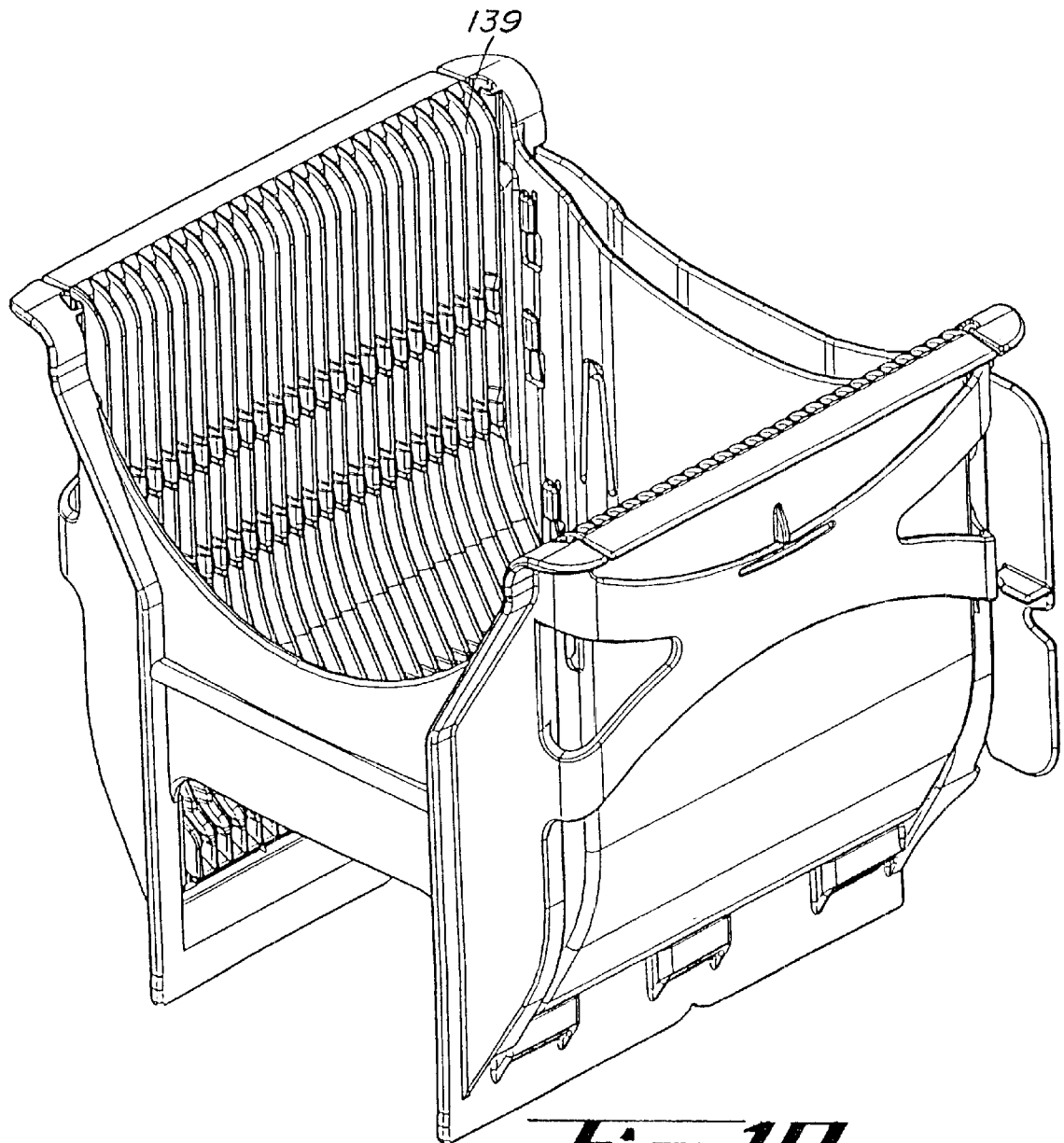
FIG. 10 is a perspective view of a composite wafer carrier.
Figure 11:
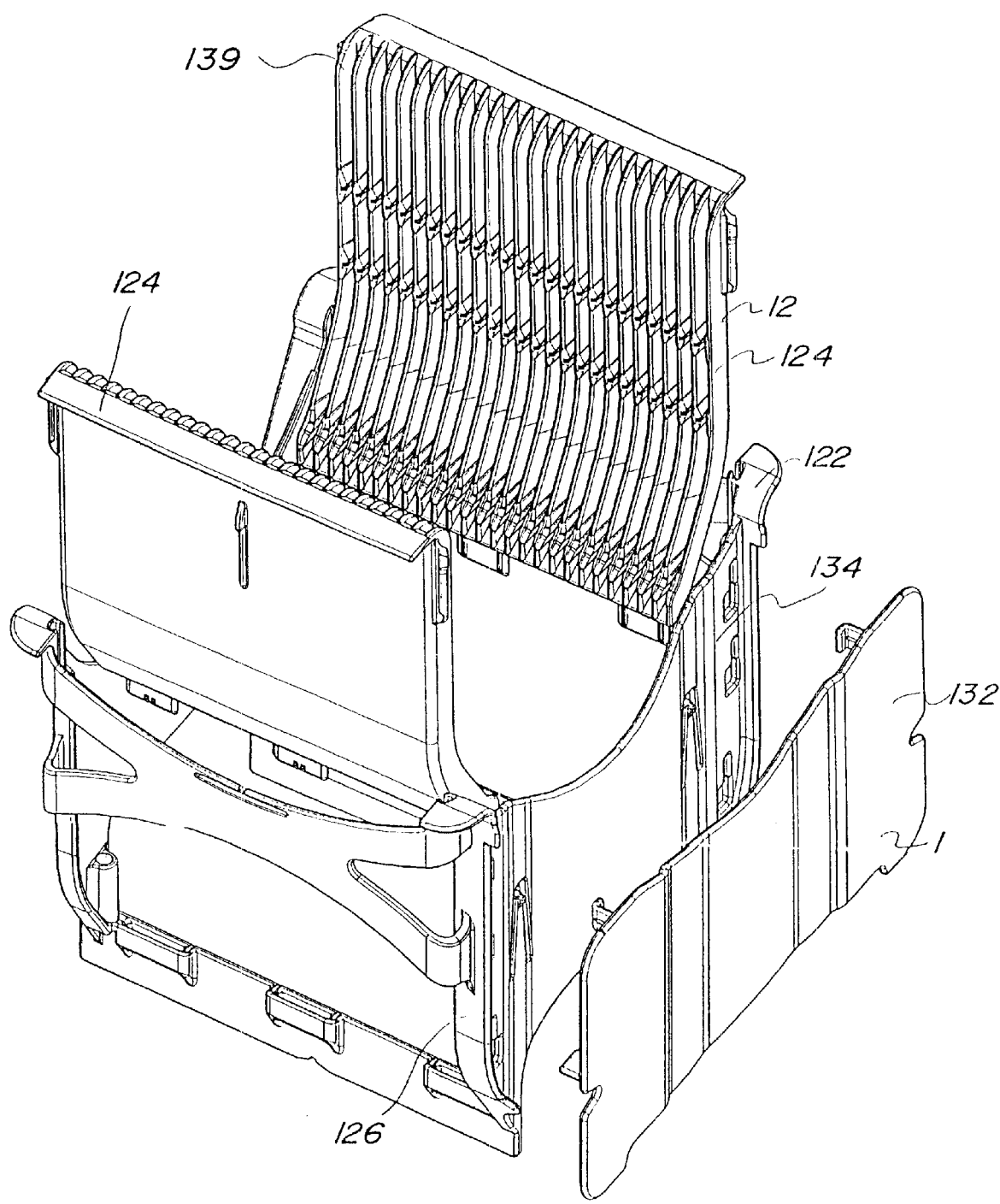
FIG. 11 is an exploded view of the wafer carrier of FIG. 10.

Referring to FIGS. 10 and 11, a composite wafer carrier made of assembled components 122 is disclosed. Components comprise side wall portions 124 as well as a carrier framework 126. The side wall inserts 124 fit within and engage the framework 126 to form a secure and assembled wafer carrier. Additionally, a robot flange or machine interface 132 may be provided on the rear end 134 of the carrier. In this case each of the side wall portions may have overmolded wafer engaging portions 139 in order to minimize particle generation by the scrapping of the wafers. The overmolding can be under tighter dimensional control than the base portion to provide low tolerance positioning of the wafers.

Referring to FIG. 13 a schematic view illustrating a methodology for accomplishing the invention is shown. First a mold is provided for making a base or support portion which can be a carrier framework or other carrier portion such as a side wall base portion 130 as is illustrated. The base portion is molded and is then put into an additional mold or alternately the same mold with a mold insert removed. Then the mold is closed and additional overmolding material such as PEEK is injected into the mold cavity which corresponds to the specific portions which are being overmolded. Then the completed portion which comprises the base portion and the overmolded portion is removed. If such a base portion is a component part then the component part is assembled into a carrier 136.

In particular applications it may be suitable to have the first injection molded portion, the base portion to be relatively smaller volumetrically than the second, overmolded portion. In other applications a first material may be deposited at critical positions in a mold, for example the wafer contact areas, the material is allowed to solidify, and a second support portion is overmolded onto the first material without changing molds.

In other particular applications, the second material does not have to be allowed to solidify, the two materials may join while both are molten. This coinjection molding may not offer the precision in locating the interface between the first portion and the second portion; it does, however, eliminate the need for the extra mold and the steps of allowing the first portion to solidify, removing the portion from the mold, and placement of the first portion in a second mold.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. A process for manufacturing a wafer carrier comprising the steps of:
   melting a first plastic that comprises a polycarbonate resin, wherein the polycarbonate material has a glass transition temperature,
   injection molding a base portion of the first plastic in a first mold portion,
   placing the molded base portion in a second mold portion, and
   overmolding a plurality of wafer contact portions on the base portion using a second different plastic thereby forming a bond without mechanical fasteners between the wafer contact portions and the base portion forming the wafer carrier, wherein a temperature of the second mold is maintained below the glass transition temperature of the polycarbonate resin when overmolding the plurality of wafer contact portions.

2. The process of claim 1 further comprising the step of melting a resin comprised of one of the set of polyetheretherketone and polyetherimide as the second plastic.

3. The process of claim 2 further comprising the addition of carbon fiber to the one of the set of polyetheretherketone and polyetherimide.

4. A process for manufacturing an integral composite wafer carrier portion comprising:
   a) injecting a first thermoplastic material into a mold cavity at a predetermined location to form a carrier base portion, wherein the first thermoplastic has dimensional stability;
   b) injecting a second thermoplastic material contacting the first material while the second material is molten to form a disk engaging wafer contact portion with an interface therebetween, wherein the disk engaging wafer contact portion defines a plurality of slots for holding a plurality of wafers, and
   c) allowing the second portion to cool thereby solidifying the second thermoplastic material and thereby forming a bond between the first portion and the second portion.

5. The process of claim 4 further comprising the step of allowing the first portion to solidify before injection of the second thermoplastic material.

6. The process of claim 5 wherein the mold cavity is a first mold cavity and wherein the process further comprises the step of removing the first portion from the first mold cavity and placing the first portion in a second mold cavity before the injection of the second material.

7. A process of molding a wafer carrier comprising the steps of claim 4 and further comprising the step of: assembling the integral composite wafer carrier portion with at least one additional component to thereby form the wafer carrier.

8. A process of molding a wafer carrier comprising the steps of claim 4 and further comprising the step of removing the wafer portion from the second mold cavity wherein said integral composite wafer carrier portion comprises the wafer carrier.

9. The process of molding a wafer carrier comprising the steps of claim 4 and further comprising the steps of: removing the integral composite overmolded wafer carrier portion and assembling the integral composite overmolded wafer carrier portion with at least one additional component to thereby form the wafer carrier.

10. A process for manufacturing a wafer carrier comprising the steps of:
    injection molding an integral support base portion of a first plastic material in a first mold portion, wherein the first plastic material has dimensional stability;
    placing the molded integral support base portion in a second mold portion; and
    overmolding a plurality of disk engaging wafer contact portions to the integral support base portion using a second plastic material in a second mold portion, wherein the plurality of disk engaging wafer contact portions define a plurality of slots for holding a plurality of wafers, wherein the second plastic material is different from the first plastic material, wherein the second plastic material bonds with the plastic material without mechanical fasteners between the wafer contact portions and the integral support base portion, and wherein the second material has at least one of the following characteristics: reducing static discharge and resisting abrasion.

11. The process for manufacturing a wafer carrier of claim 10, and further comprising the step of removing the integral composite overmolded wafer carrier portion from the second mold portion, wherein the integral composite overmolded wafer carrier portion comprises the wafer carrier.

* * * * *